(12) United States Patent
Liu et al.

(10) Patent No.: US 9,331,173 B2
(45) Date of Patent: May 3, 2016

(54) SEMICONDUCTOR DEVICE HAVING A CARBON CONTAINING INSULATION LAYER FORMED UNDER THE SOURCE/DRAIN

(71) Applicant: Taiwan Semiconductor Manufacturing Company Limited, Hsin-Chu (TW)

(72) Inventors: Shih-Wen Liu, Taoyuan (TW); Mei-Yun Wang, Chu-Pei (TW); Hsien-Cheng Wang, Hsinchu (TW); Fu-Kai Yang, Hsinchu (TW); Hsiao-Chiu Hsu, Hsinchu (TW); Hsin-Ying Lin, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/809,614

(22) Filed: Jul. 27, 2015

(65) Prior Publication Data

US 2015/0333149 A1 Nov. 19, 2015

Related U.S. Application Data

(62) Division of application No. 14/148,251, filed on Jan. 6, 2014, now Pat. No. 9,093,299.

(51) Int. Cl.
*H01L 21/4763* (2006.01)
*H01L 29/66* (2006.01)
*H01L 27/088* (2006.01)
*H01L 29/45* (2006.01)
*H01L 29/417* (2006.01)
*H01L 21/8234* (2006.01)
*H01L 29/06* (2006.01)
*H01L 29/40* (2006.01)

(52) U.S. Cl.
CPC .. *H01L 29/66545* (2013.01); *H01L 21/823475* (2013.01); *H01L 27/088* (2013.01); *H01L 29/0653* (2013.01); *H01L 29/401* (2013.01); *H01L 29/4175* (2013.01); *H01L 29/45* (2013.01); *H01L 29/66484* (2013.01); *H01L 29/66795* (2013.01)

(58) Field of Classification Search
CPC ............... H01L 21/76838; H01L 21/76843; H01L 21/76877; H01L 21/823475; H01L 21/823871; H01L 24/18; H01L 24/19; H01L 224/18; H01L 224/19
See application file for complete search history.

(56) References Cited

U.S. PATENT DOCUMENTS

2007/0298599 A1* 12/2007 Jang ................ H01L 21/823412
438/585

* cited by examiner

*Primary Examiner* — Hoai V Pham
(74) *Attorney, Agent, or Firm* — Cooper Legal Group, LLC

(57) ABSTRACT

A semiconductor arrangement and method of formation are provided herein. A semiconductor arrangement includes a metal connect in contact with a first active region and a second active region, and over a shallow trench isolation region located between the first active region and a second active region. A method of forming the semiconductor arrangement includes recessing the metal connect over the STI region to form a recessed portion of the metal connect. Forming the recessed portion of the metal connect in contact with the first active region and the second active region mitigates RC coupling, such that a first gate is formed closer to a second gate, thus reducing a size of a chip on which the recessed portion is located.

20 Claims, 15 Drawing Sheets

SEMICONDUCTOR DEVICE HAVING A CARBON CONTAINING INSULATION LAYER FORMED UNDER THE SOURCE/DRAIN

RELATED APPLICATION

This application is a divisional of U.S. Non-Provisional patent application Ser. No. 14/148,251, titled "SEMICONDUCTOR ARRANGEMENT AND FORMATION THEREOF" and filed on Jan. 6, 2014, which is incorporated herein by reference.

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

DESCRIPTION OF THE DRAWINGS

Aspects of the disclosure are understood from the following detailed description when read with the accompanying drawings. It will be appreciated that elements and/or structures of the drawings are not necessarily drawn to scale. Accordingly, the dimensions of the various features may be arbitrarily increased and/or reduced for clarity of discussion.

DETAILED DESCRIPTION

Figure 1:
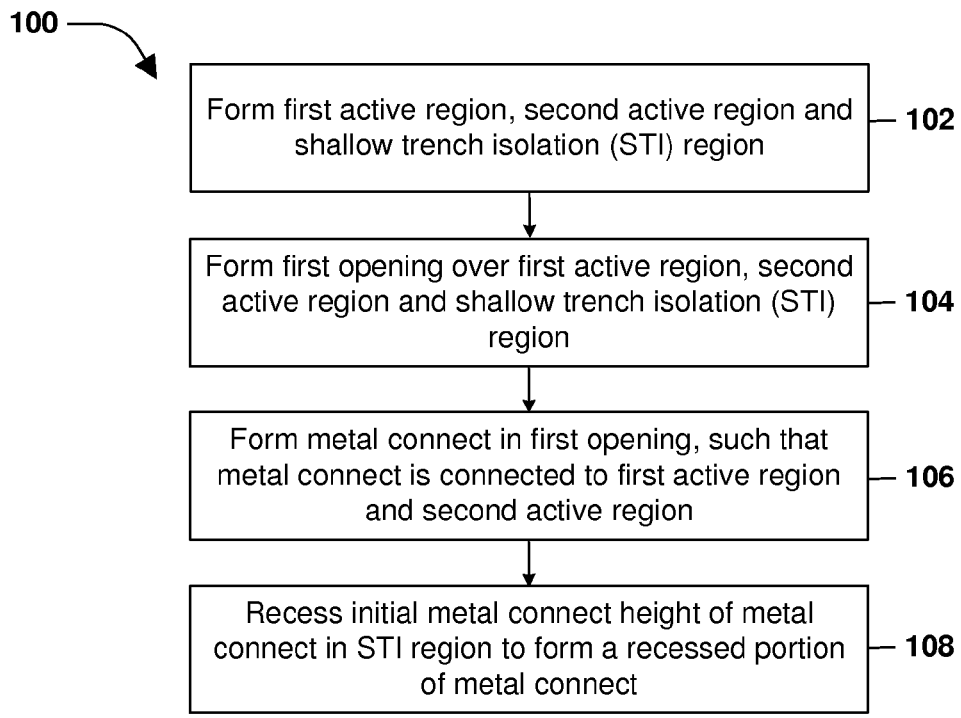
FIG. 1 is a flow diagram illustrating a method of forming a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

According to some embodiments, a semiconductor arrangement comprises a first active region, a second active region and a shallow trench isolation (STI) region, the STI region between the first active region and the second active region. According to some embodiments, a metal connect is over the first active region, the STI region and the second active region and connected to the first active region and the second active region. In some embodiments, the metal connect comprises a first unrecessed portion of the metal connect over the first active region, the first unrecessed portion having a first height, a recessed portion of the metal connect over the STI region having a second height and a second unrecessed portion of the metal connect over the second active region having a third height, such that the first height and the third height are greater than the second height. In some embodiments, the first height, the second height and the third height are measured from a top surface of the metal connect to a bottom surface of the metal connect. In some embodiments, the first active region is one of a source or a drain. In some embodiments, the second active region is one of a source or a drain. In some embodiments, the metal connect connects at least one of a source of the first active region to a source of the second active region, a drain of the first active region to a drain of the second active region, or a source of the first active region to a drain of the second active region. In some embodiments, the metal connect mitigates resistance-capacitance (RC) coupling because a distance between the metal connect and a first metal contact in contact with a first gate associated with the semiconductor arrangement is greater than a distance between the first metal contact and a different metal connect that would otherwise be used to connect the first active region to the second active region, such as a different metal connect that does not comprises the recessed portion. In some embodiments, a reduced or minimized RC coupling between the metal contact and the metal connect results in a smaller semiconductor arrangement than a semiconductor arrangement without a recessed portion of a metal connect connecting a first active region to a second active region. In some embodiments, a smaller semiconductor arrangement results because the first gate is formed closer to a second gate than in a semiconductor arrangement that lacks a greater distance between the metal connect and the metal contact due to the metal connect comprising the recessed portion. In some embodiments, the first gate is a first distance from a second gate, and the first distance is between about 30 nm to about 150 nm.

According to some embodiments, forming a semiconductor arrangement comprises forming a first opening over a first active region, a shallow trench isolation (STI) region and a second active region, such that the first opening exposes the first active region and the second active region. According to some embodiments, a metal connect is formed in the first opening such that the metal connect connects the first active region to the second active region. In some embodiments, the metal connect has an initial height. In some embodiments, the initial height of the metal connect is recessed in the STI region to form a recessed portion of the metal connect having a second height. In some embodiments, the second height is less than a first height of a first unrecessed portion of the metal connect over the first active region and a third height of a second unrecessed portion of the metal connect over the second active region. In some embodiments, the first height is substantially equal to the third height. In some embodiments, a contact opening is formed over a gate in the STI region. In some embodiments, a metal contact is formed in the contact opening.

A method 100 of forming a semiconductor arrangement 200 according to some embodiments is illustrated in FIG. 1 and one or more structures formed thereby at various stages of fabrication are illustrated in FIGS. 2-41. According to some embodiments, such as illustrated in FIG. 41, the semiconductor arrangement 200 comprises a first active region 205, a second active region 207 and a shallow trench isolation (STI) region 209, the STI region 209 between the first active region 205 and the second active region 207. According to some embodiments, a first unrecessed portion 226a of a metal connect 226 is over the first active region 205 and connected to the first active region 205. According to some embodiments, a second unrecessed portion 226b of the metal connect 226 is over the second active region 207 and connected to the second active region 207. In some embodiments, a recessed portion 226c of the metal connect 226 is in the STI region 209, such that the recessed portion 226c of the metal connect 226 connects the first unrecessed portion 226a of metal connect 226 to the second unrecessed portion 226b of the metal connect 226 thereby connecting the first active region 205 to the second active region 207.

Figure 2:
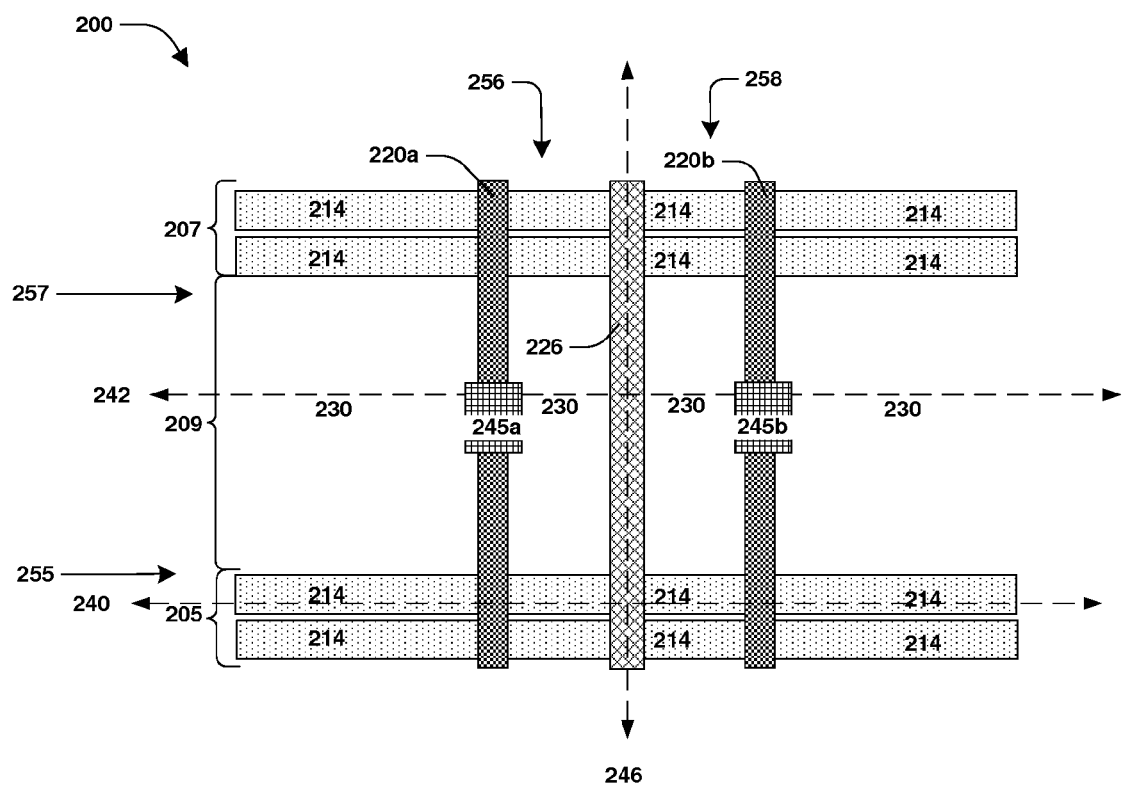
FIG. 2 is an illustration of a semiconductor arrangement, according to some embodiments.
Figure 38:
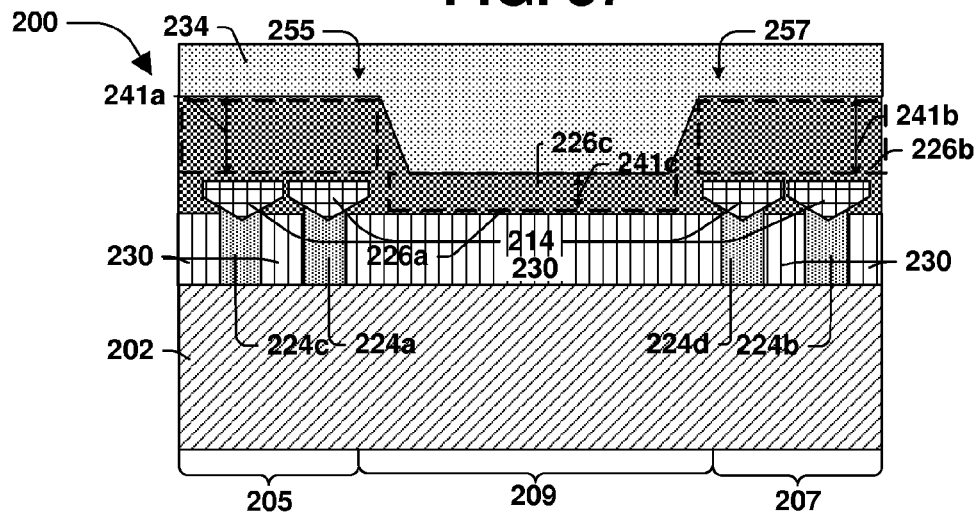
FIG. 38 is an illustration of a semiconductor arrangement, according to some embodiments.
Figure 39:
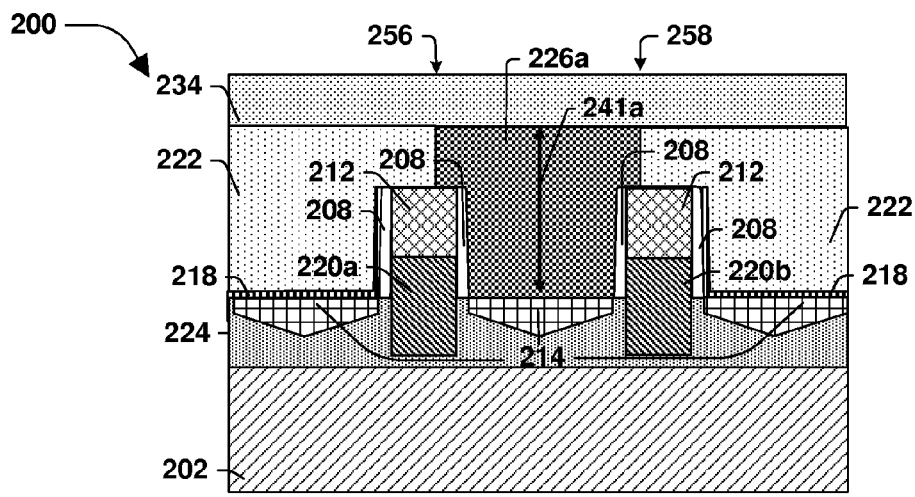
FIG. 39 is an illustration of a semiconductor arrangement, according to some embodiments.
Figure 40:
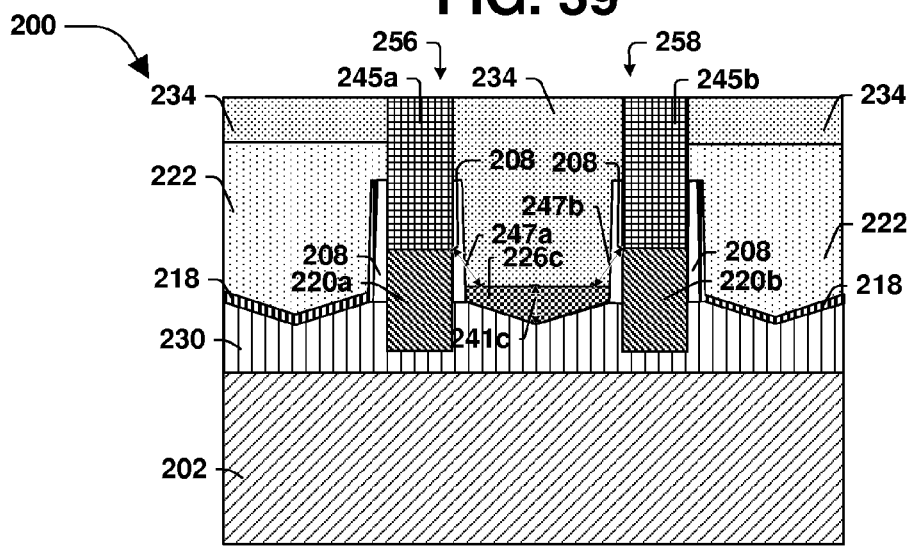
FIG. 40 is an illustration of a semiconductor arrangement, according to some embodiments.
Figure 41:
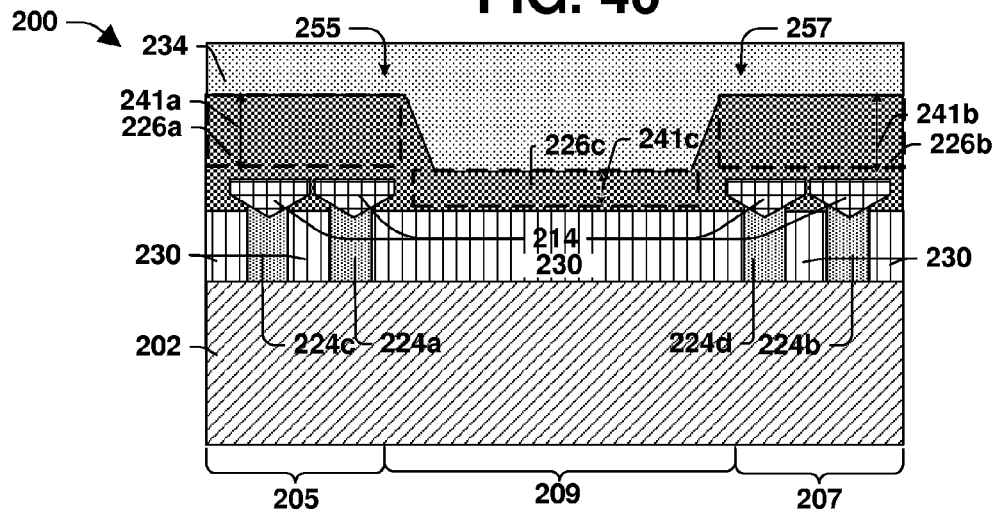
FIG. 41 is an illustration of a semiconductor arrangement, according to some embodiments.

FIG. 2 illustrates an overview or top down view of the semiconductor arrangement 200 according to some embodiments, where a first dielectric layer 222 and a second dielectric layer 234, as illustrated in FIGS. 39-41 are not shown, so that features underlying the first dielectric layer 222 and the second dielectric layer 234 are visible. In FIG. 2, a first active region 205 comprises epitaxial caps 214, a first gate 220a, a second gate 220b, and a metal connect 226. In some embodiments, an STI region 209 comprises STI 230, the first gate 220a, the second gate 220b, a first metal contact 245a over the first gate 220a, a second metal contact 245b over the second gate 220b and the metal connect 226. In some embodiments, a second active region 207 comprises epitaxial caps 214, the first gate 220a, the second gate 220b, and the metal connect 226. In FIG. 2 three lines 240, 242 and 246 are drawn to illustrate cross-sections that are depicted in other Figs. A first line 240, cuts through the first active region 205. FIGS. 3, 6, 9, 12, 15, 18, 21, 24, 27, 30, 33, 36 and 39 are cross sectional views of the semiconductor arrangement 200 taken along the first line 240 at various stages of fabrication. A second line 242, cuts through the STI region 209, the first gate 220a, the second gate 220b, the first metal contact 245a over the first gate 220a, the second metal contact 245b over the second gate 220b and the metal connect 226, where the STI region 209 comprises STI 230. FIGS. 4, 7, 10, 13, 16, 19, 22, 25, 28, 31, 34, 37 and 40 are cross-sectional views of the semiconductor arrangement 200 taken along the second line 242 at various stages of fabrication. A third line 246, cuts through the metal connect 226, according to some embodiments, where the metal connect 226 is formed to connect the first active region 205 to the second active region 207. FIGS. 5, 8, 11, 14, 17, 20, 23, 26, 29, 32, 35, 38 and 41 are a cross-sectional views of the semiconductor arrangement 200 taken along the third line 246 at various stages of fabrication.

Figure 3:
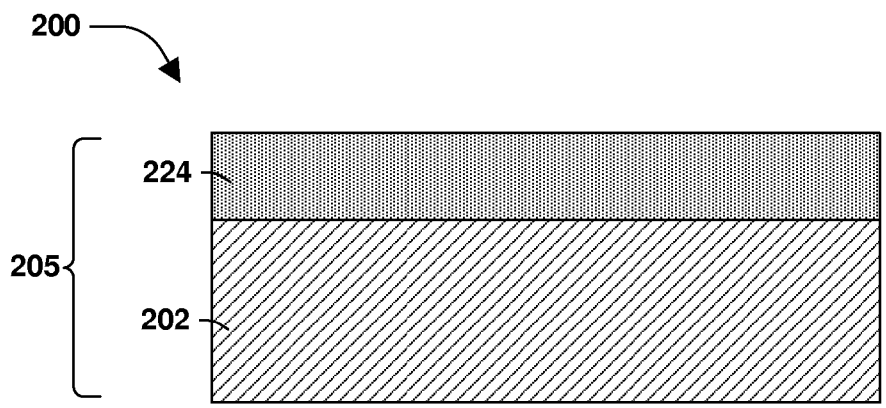
FIG. 3 is an illustration of a semiconductor arrangement, according to some embodiments.
Figure 4:
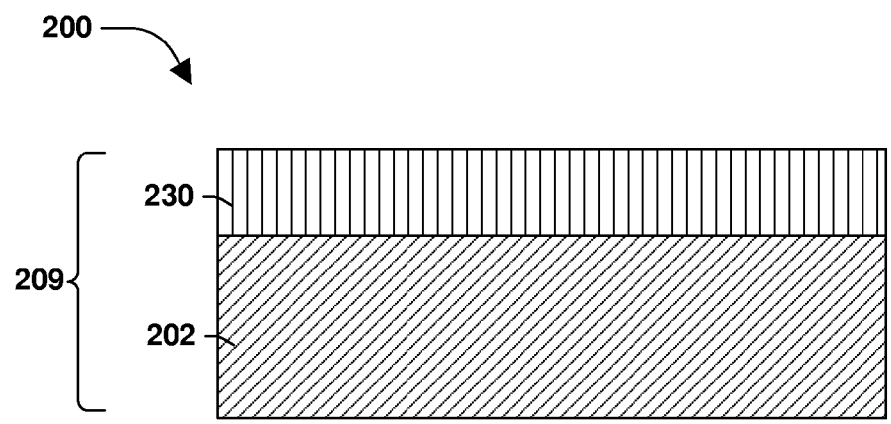
FIG. 4 is an illustration of a semiconductor arrangement, according to some embodiments.
Figure 5:
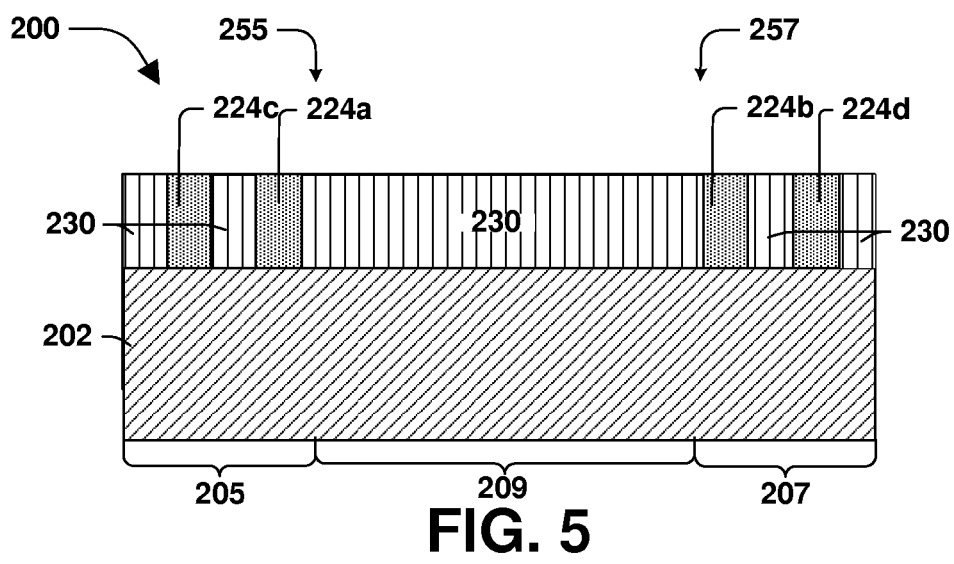
FIG. 5 is an illustration of a semiconductor arrangement, according to some embodiments.

At 102, a first active region 205, a second active region 207 and an STI region 209 are formed, according to some embodiments. In some embodiments, fins 224 are formed in an STI 230 to form an initial structure of the first active region 205 comprising a first fin 224a and a third fin 224c and the second active region 207 comprising a second fin 224b and a fourth fin 224d, as illustrated in FIG. 5. In some embodiments, the first fin 224a is on a first side 255 of the STI region 209, such that the first fin 224a is between the third fin 224c and the STI region 209. In some embodiments, the second fin 224b is on a second side 257 of the STI region 209, such that the second fin 224b is between the fourth fin 224d and the STI region 209. Turning to FIG. 3, which illustrates a cross-section of the first line 240 of FIG. 2, where the first line 240 cuts through the first active region 205. The semiconductor arrangement 200 comprises a substrate 202. In some embodiments, the substrate 202 comprises at least one of silicon, silicon oxide, or silicon nitride. According to some embodiments, the substrate 202 comprises at least one of an epitaxial layer, a silicon-on-insulator (SOI) structure, a wafer, or a die formed from a wafer. In some embodiments, STI 230 is formed over the substrate 202. In some embodiments, the STI 230 comprises a dielectric material, such as silicon oxide (SiO$_2$). In some embodiments, the STI 230 formation comprises deposition of a dielectric material. In some embodiments, the STI region 209 comprises STI 230. In some embodiments, the STI 230 has a thickness between about 20 nm to about 70 nm. Turning to FIG. 4, which illustrates a cross-section of the second line 242 of FIG. 2, where the second line 242 cuts through the STI region 209, the STI 230 is formed over the substrate 202. In some embodiments, the fins 224 comprise the same material as the substrate 202. In some embodiments, the fins 224 have a height between 5 nm to about 45 nm.

Figure 6:
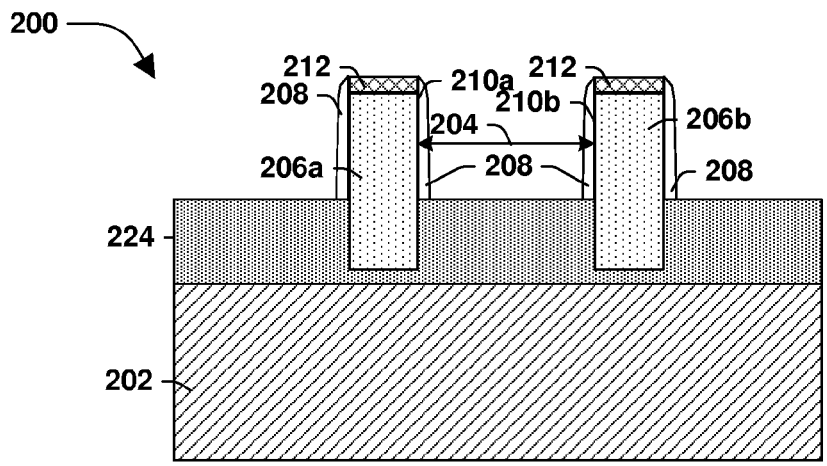
FIG. 6 is an illustration of a semiconductor arrangement, according to some embodiments.
Figure 7:
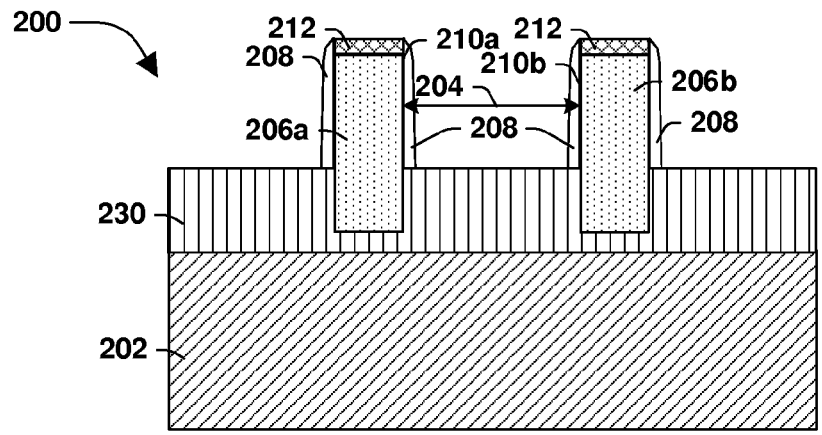
FIG. 7 is an illustration of a semiconductor arrangement, according to some embodiments.
Figure 8:
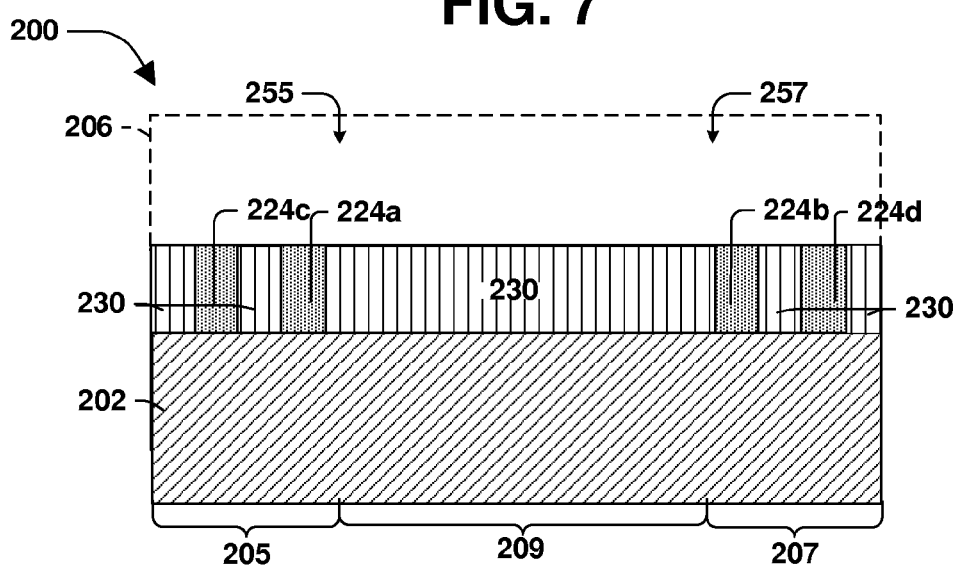
FIG. 8 is an illustration of a semiconductor arrangement, according to some embodiments.

According to some embodiments, FIGS. 6-8 illustrate the formation of first dummy poly 206a, a second dummy poly 206b, sidewall spacers 208 on both sides of the first dummy poly 206a and the second dummy poly 206b and the formation of a first hard mask 212 over the first dummy poly 206a and the second dummy poly 206b, according to some embodiments. In some embodiments, the dummy poly 206 comprises an inactive and non-functional material. In some embodiments, the first dummy poly 206a is a first distance 204 from the second dummy poly 206b. In some embodiments, the first distance 204 is measured from a first sidewall 210a of the dummy poly 206a to a second sidewall 210b of the second dummy poly 206b. In some embodiments, the first distance 204 is between about 30 nm to about 150 nm. In some embodiments, the sidewall spacers 208 comprise at least one of silicon, oxide, or nitride. In some embodiments, the first hard mask 212 comprises at least one of silicon, oxide or nitride. Turning to FIG. 8, the dummy poly 206 is shown in phantom.

Figure 9:
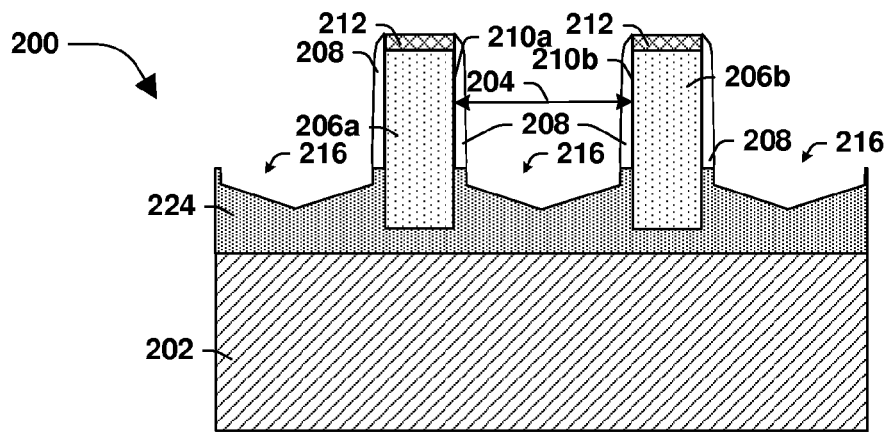
FIG. 9 is an illustration of a semiconductor arrangement, according to some embodiments.
Figure 10:
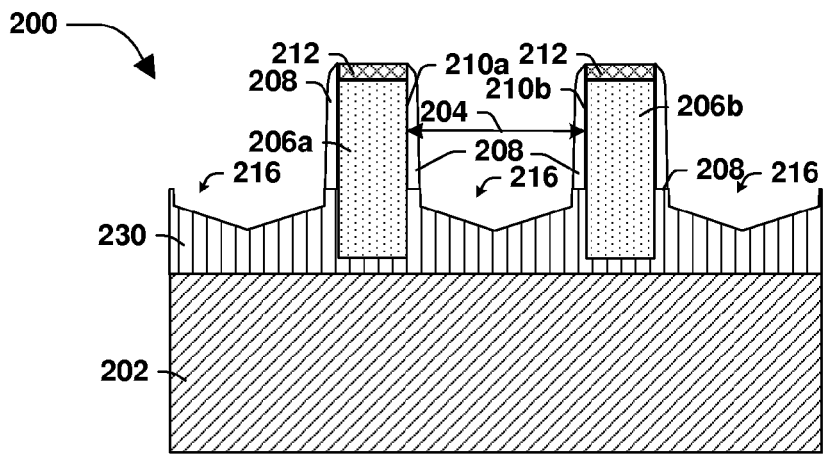
FIG. 10 is an illustration of a semiconductor arrangement, according to some embodiments.
Figure 11:
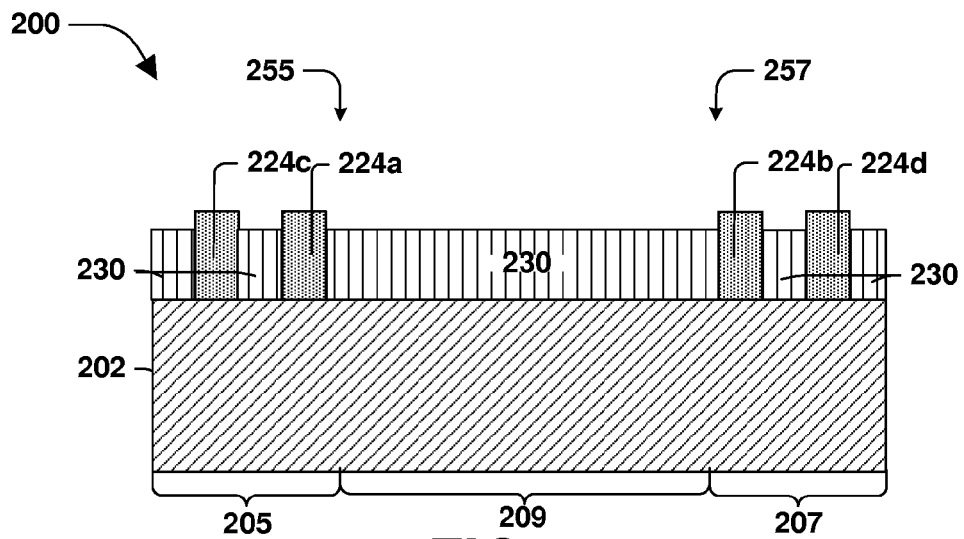
FIG. 11 is an illustration of a semiconductor arrangement, according to some embodiments.

According to some embodiments, FIGS. 9-11 illustrate the formation of an Epi cap opening 216 is the first active region 205, the second active region 207 and the STI region 209. In some embodiments, the Epi cap opening 216 is formed adjacent at least one of the first dummy poly 206a or the second dummy poly 206b. In some embodiments, the Epi cap opening 216 is formed by etching, such as by a dry etch. In some embodiments, the Epi cap opening 216 exposes at least a portion of sidewalls of the fins 224, as illustrated in FIG. 11.

Figure 12:
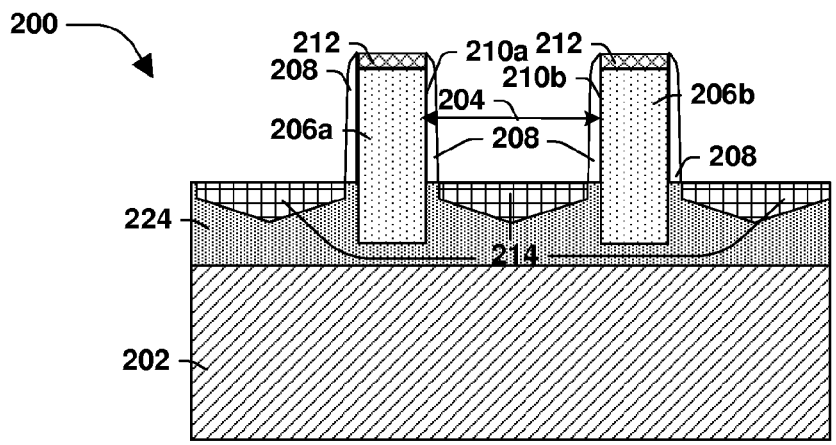
FIG. 12 is an illustration of a semiconductor arrangement, according to some embodiments.
Figure 13:
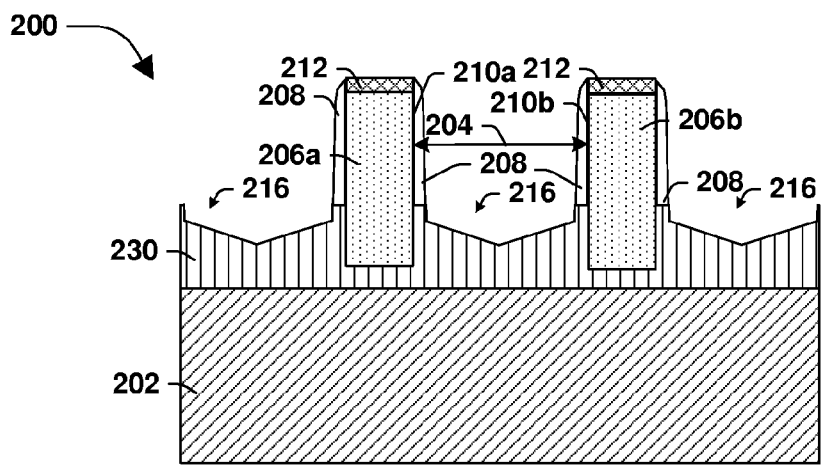
FIG. 13 is an illustration of a semiconductor arrangement, according to some embodiments.
Figure 14:
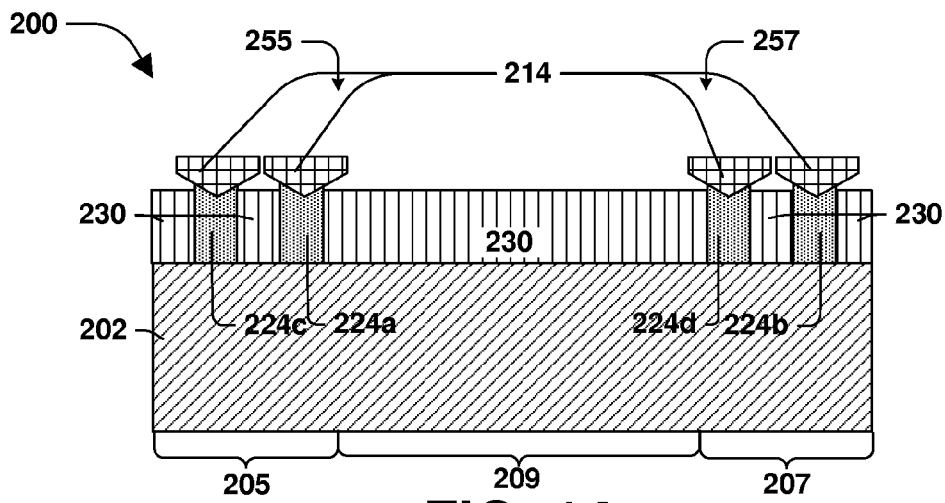
FIG. 14 is an illustration of a semiconductor arrangement, according to some embodiments.

According to some embodiments, FIGS. 12-14 illustrate the formation of epitaxial (Epi) caps 214 in the Epi cap opening 216, such that the Epi caps 214 are formed over the fins 224 in the first active region 205 and the second active region 207. In some embodiments, a first Epi cap 214 is formed over the first fin 224a, and a third Epi cap 214 is formed over the third fin 224c in the first active region 205, as illustrated in FIGS. 12 and 14. In some embodiments, a second Epi cap 214 is formed over the second fin 224b, and a fourth Epi cap 214 is formed over the fourth fin 224d in the second active region 207, as illustrated in FIG. 14. Although, four fins 224 and four Epi caps 214 are shown, any number of Epi caps 214 over any number of fins 224 are contemplated. In some embodiments, the Epi caps 214 are grown, such that the Epi caps 214 are only formed over a silicon, such as the silicon in the fins 224. In some embodiment, Epi caps 214 are not formed in the STI region 209, due to the STI region 209 comprising at least one of a nitride or an oxide. In some embodiments, the Epi caps 214 in the first active region 205 have a fourth height between about 20 nm to about 60 nm. In some embodiments, the Epi caps 214 in the second active region 207 have a fifth height between about 20 nm to about 60 nm. In some embodiments, the fourth height and the fifth height are measured from the bottom most surface of the Epi cap 214 to a top surface of the Epi cap 214. In some embodiments, the Epi cap 214 comprises at least one of silicon, nitride, or oxide. In some embodiments, the Epi cap 214 comprises at least one of a source or a drain.

Figure 15:
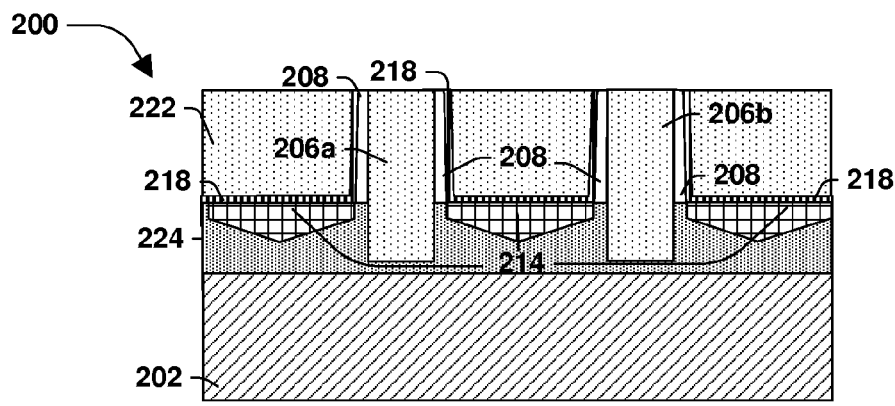
FIG. 15 is an illustration of a semiconductor arrangement, according to some embodiments.
Figure 16:
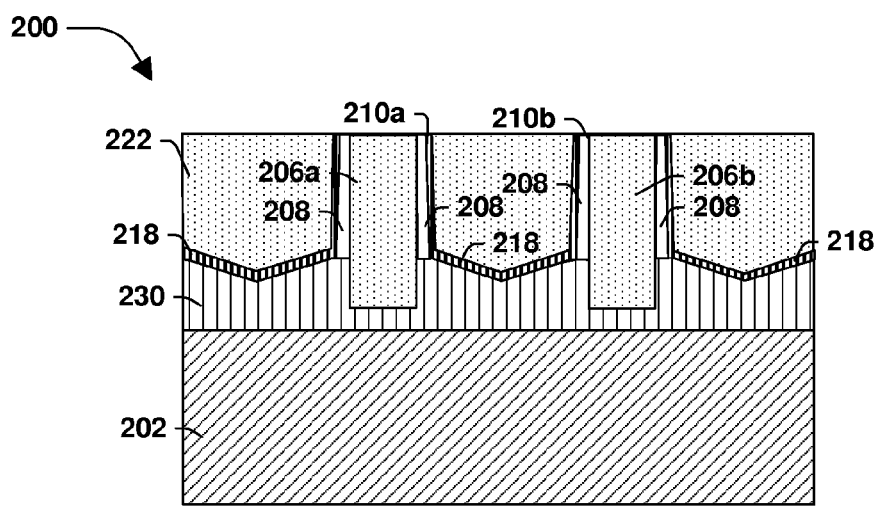
FIG. 16 is an illustration of a semiconductor arrangement, according to some embodiments.
Figure 17:
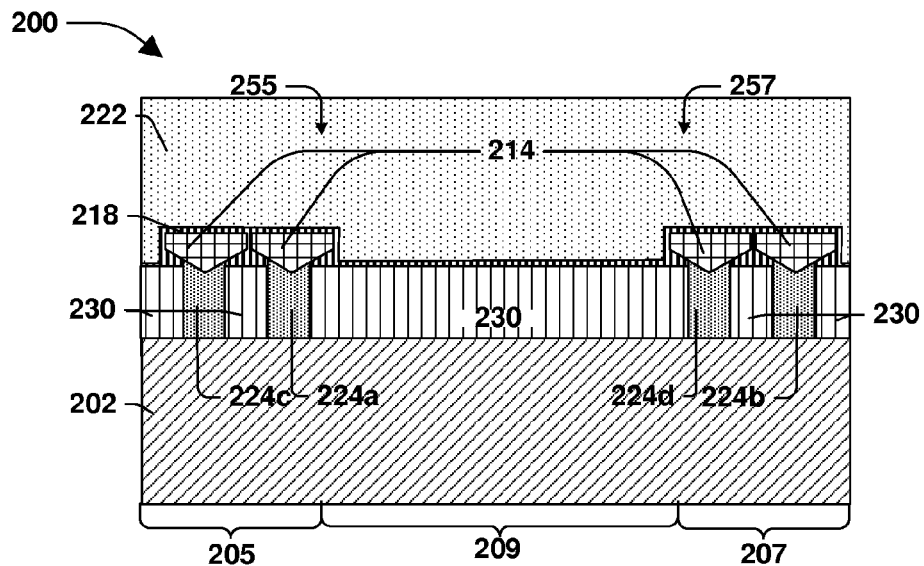
FIG. 17 is an illustration of a semiconductor arrangement, according to some embodiments.

According to some embodiments, FIGS. 15-17 illustrate the formation of a nitride liner 218, the formation of a first dielectric layer 222 over the nitride liner 218 and the removal of the first hard mask 212 and the nitride liner 218 over the first hard mask 212. In some embodiments, the nitride liner 218 is formed over the sidewall spacers 208 and first hard mask 212 of the first dummy poly 206a and the second dummy poly 206b, the Epi cap 214 and in the Epi cap opening 216 in the STI region 209, where no Epi caps 214 were formed. In some embodiments, the nitride liner 218 is at least one of grown or deposited. In some embodiments, the nitride liner 218 has a nitride liner thickness between about 0.1 nm to about 10 nm. In some embodiments, the first dielectric layer 222 is formed over the nitride liner 218. In some embodiments, the first dielectric layer 222 comprises oxide. In some embodiments, the first dielectric layer 222 is one of grown or deposited. In some embodiments, the first dielectric layer 222 is planerized, such as by chemical mechanical planarization (CMP). In some embodiments, the nitride liner 218 over the first hard mask 212 and the first hard mask 212 are removed from the first dummy poly 206a and the second dummy poly 206b, such as by CMP.

Figure 18:
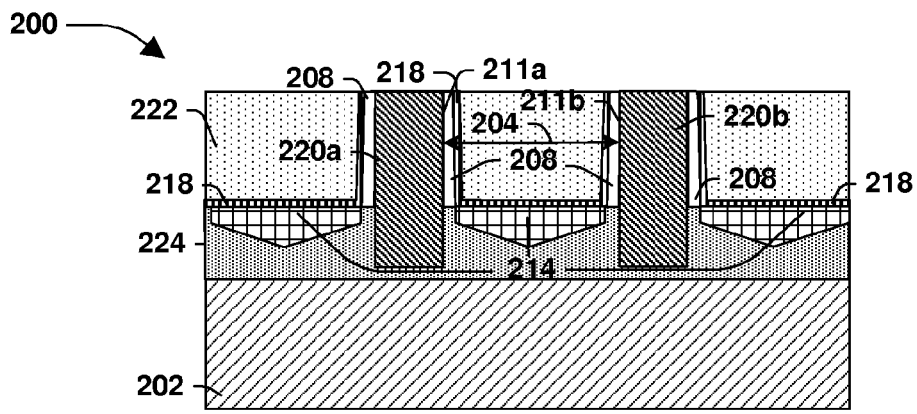
FIG. 18 is an illustration of a semiconductor arrangement, according to some embodiments.
Figure 19:
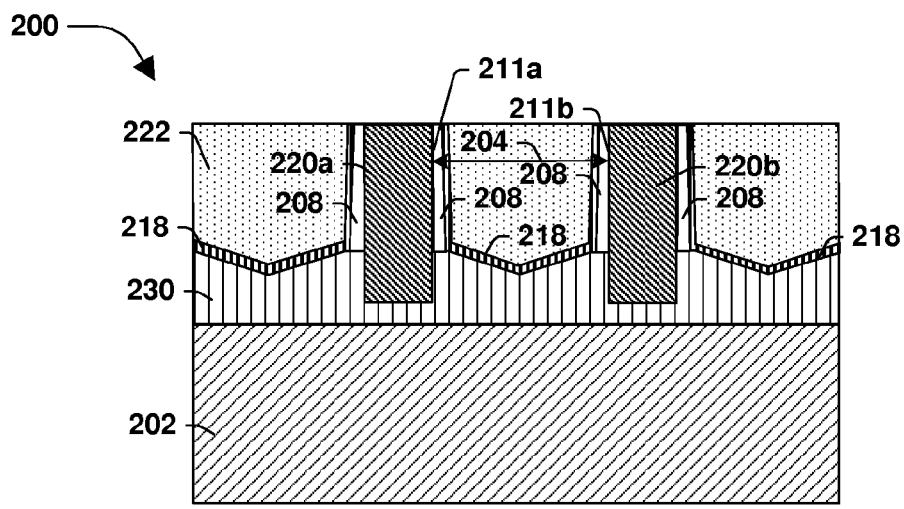
FIG. 19 is an illustration of a semiconductor arrangement, according to some embodiments.
Figure 20:
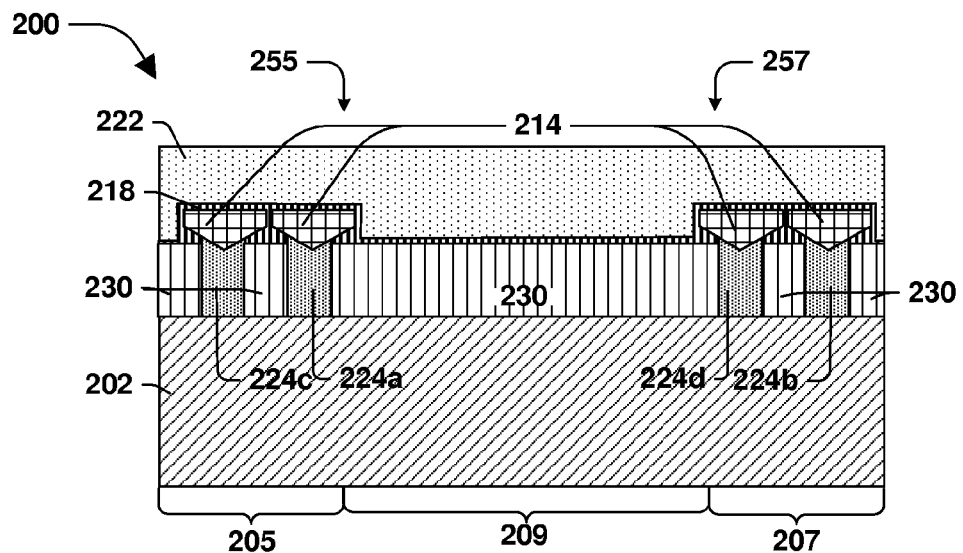
FIG. 20 is an illustration of a semiconductor arrangement, according to some embodiments.
Figure 21:
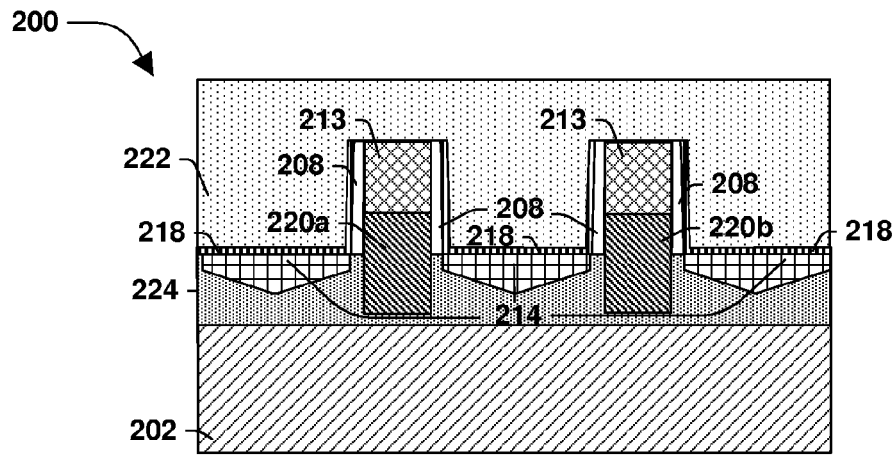
FIG. 21 is an illustration of a semiconductor arrangement, according to some embodiments.
Figure 22:
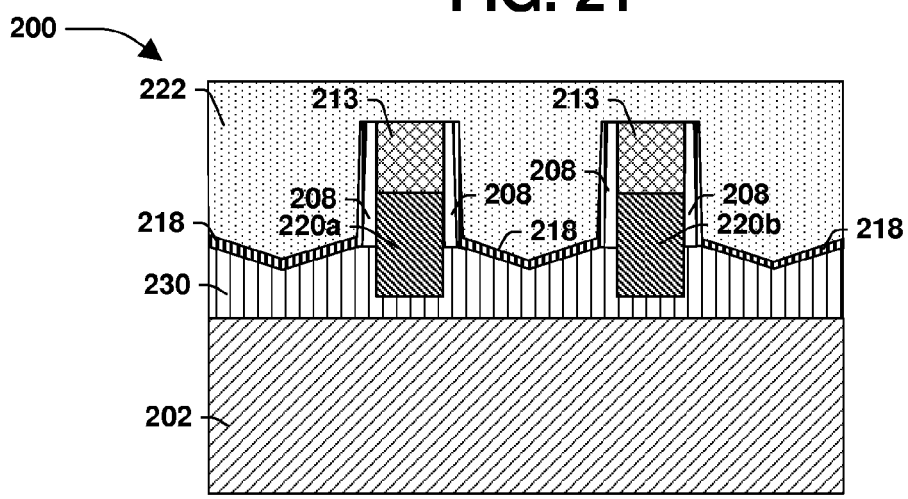
FIG. 22 is an illustration of a semiconductor arrangement, according to some embodiments.
Figure 23:
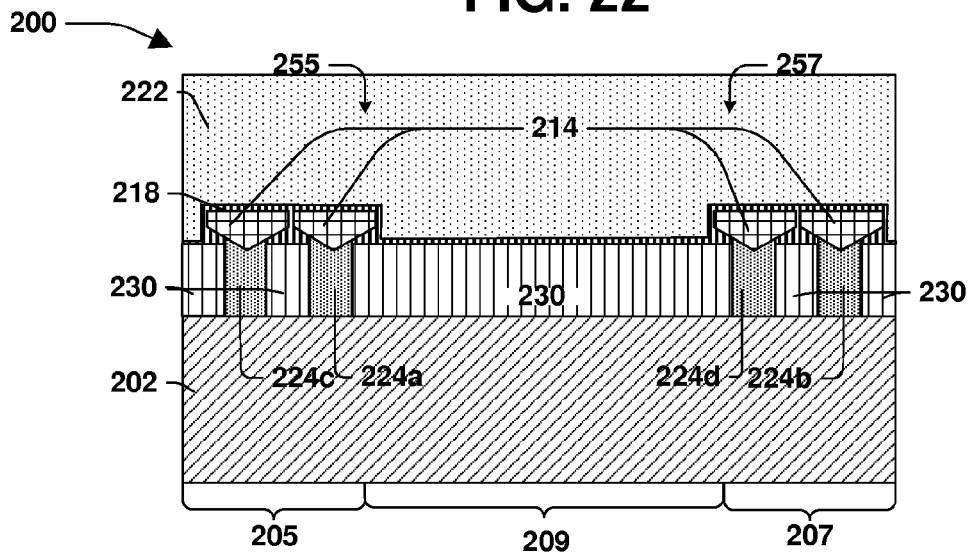
FIG. 23 is an illustration of a semiconductor arrangement, according to some embodiments.

According to some embodiments, FIGS. 18-20, illustrate the removal of the first dummy poly 206a and the second dummy poly 206b and the formation of first gate 220a and a second gate 220b. In some embodiments, the first gate 220a is formed in the location that the first dummy poly 206a occupied. In some embodiments, the second gate 220b is formed in the location that the second dummy poly 206b occupied. In some embodiments, the gate 220 comprises at least one of a polysilicon or a metal. In some embodiments, the gate 220 comprises a layer of high dielectric constant material in contact with the Epi caps 214 of the first active region 205 and the second active region 207, as illustrated in FIG. 18. In some embodiments, the high dielectric constant material comprises at least one of nitride or oxide. In some embodiment, the gate 220 is formed by deposition. In some embodiments, the gate 220 has a gate height between about 750 Å to about 1250 Å. In some embodiments, the first gate 220a is a first distance 204 from the second gate 220b. In some embodiments, the first distance 204 is measured from a first sidewall 211a of the first gate 220a to a second sidewall 211b of the second gate 220b. In some embodiments, the first distance 204 is between about 30 nm to about 150 nm. In some embodiments, a first gate height of the first gate 220a and a second gate height of the second gate 220b are reduced, such as by etching, as illustrated in FIGS. 21 and 22. In some embodiments, the first gate height and the second gate height are reduced by between about 10 nm to about 18 nm. In some embodiments, a second hard mask 213 is formed over the first gate 220a and the second gate 220b. In some embodiments, the second hard mask 213 comprises a nitride. In some embodiments, the second hard mask 213 is formed by deposition. In some embodiments, additional oxide is formed, such as by deposition, over the first dielectric layer 222 and the second hard mask 213, as illustrated in FIGS. 21-23.

Figure 24:
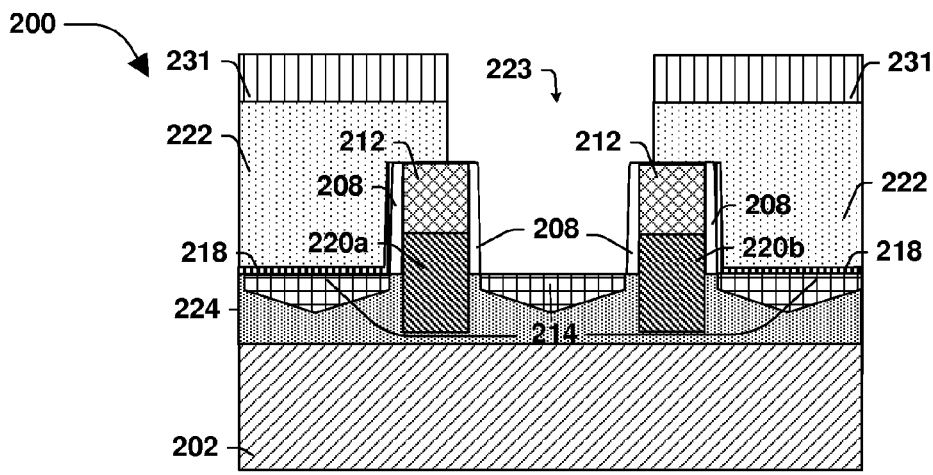
FIG. 24 is an illustration of a semiconductor arrangement, according to some embodiments.
Figure 25:
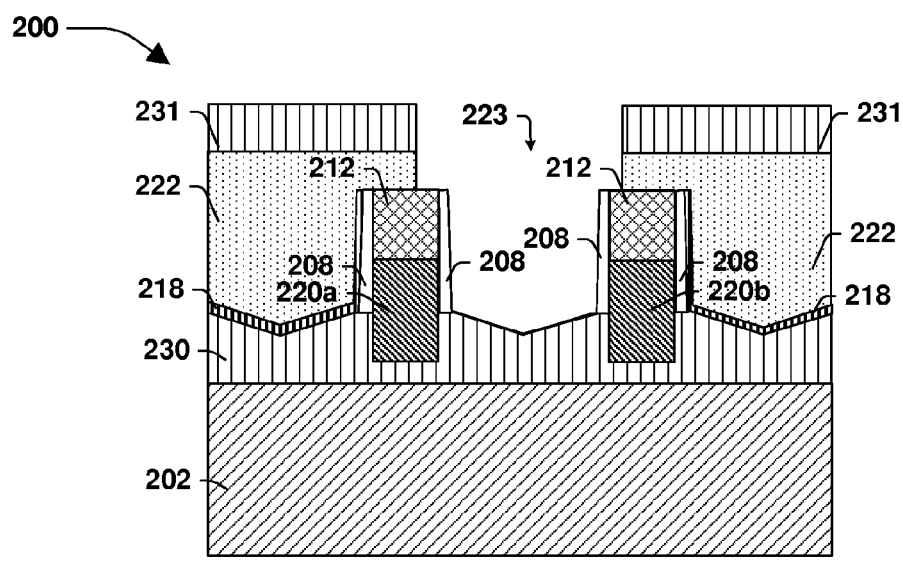
FIG. 25 is an illustration of a semiconductor arrangement, according to some embodiments.
Figure 26:
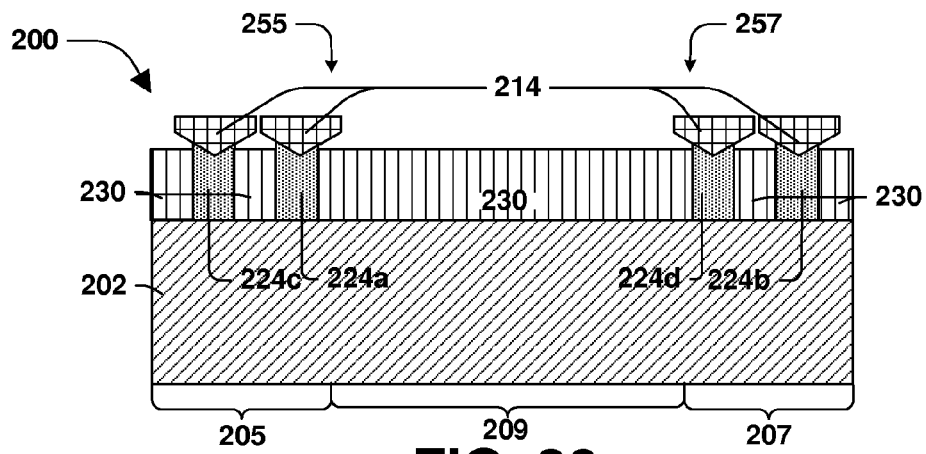
FIG. 26 is an illustration of a semiconductor arrangement, according to some embodiments.

At 104, a first opening 223 is formed in the first dielectric layer 222 over the first active region 205, the second active region 207 and the STI region 209, as illustrated in FIGS. 24-26. In some embodiment, the first opening 223 exposes the Epi cap 214 under the first dielectric layer 222 and the nitride liner 218 in the first active region 205 and the second active region 207, as illustrated in FIG. 24. In some embodiments, the first opening 223 is formed by forming a first mask 231 over the first dielectric layer 222, such that a portion of the first dielectric layer 222 is exposed over at least a portion of the first gate 220a, over at least a portion of the second gate 220b, and over the area between the first gate 220a and the second gate 220b. In some embodiments, the first opening 223 is formed by etching the portion of the first dielectric layer 222 and the nitride liner exposed by the first mask 231 such that at least part of the second hard mask 213, and the Epi caps 214 between the first gate 220a and the second gate 220b are exposed, as illustrated in FIGS. 24 and 25. In some embodiments, the first mask 231 is removed, such as by etching.

Figure 27:
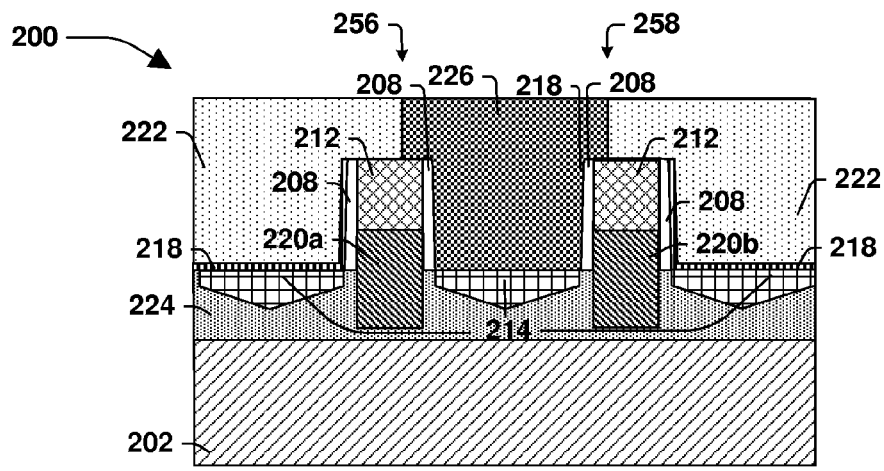
FIG. 27 is an illustration of a semiconductor arrangement, according to some embodiments.
Figure 28:
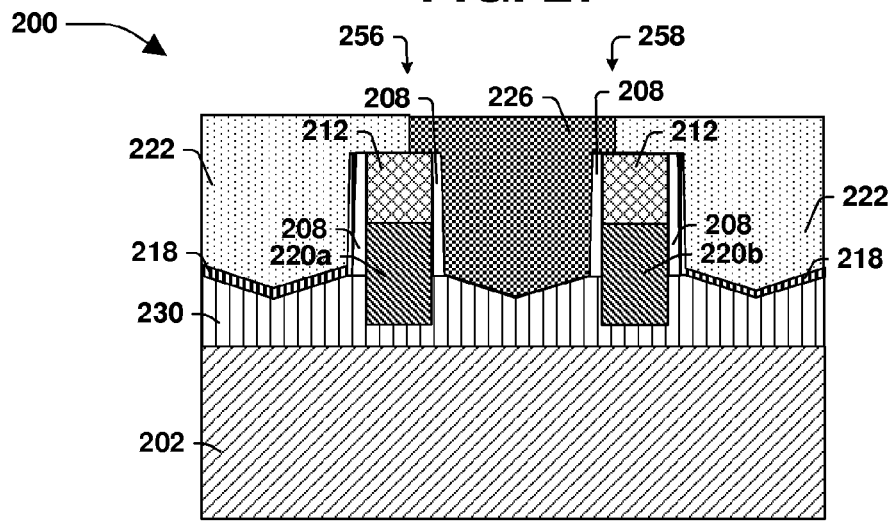
FIG. 28 is an illustration of a semiconductor arrangement, according to some embodiments.
Figure 29:
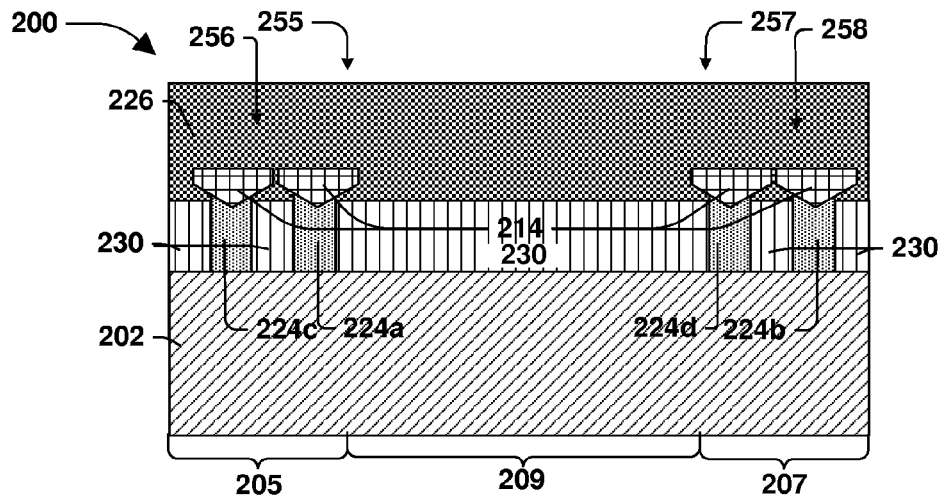
FIG. 29 is an illustration of a semiconductor arrangement, according to some embodiments.

At 106, a metal connect 226 is formed in the first opening 223, such that the metal connect 226 is connected to the first active region 205 and the second active region 207, as illustrated in FIGS. 27-29. In some embodiments, the metal connect is formed such that the first gate 220a is adjacent a first side 256 of the metal connect 226 and the second gate 220b is adjacent a second side 258 of the metal connect 226, as illustrated in FIGS. 27-28. In some embodiments, the metal connect 226 is formed by deposition. In some embodiments, the metal connect 226 comprises titanium. In some embodiments, the metal connect 226 has an initial metal connect height between about 100 Å to about 500 Å.

Figure 30:
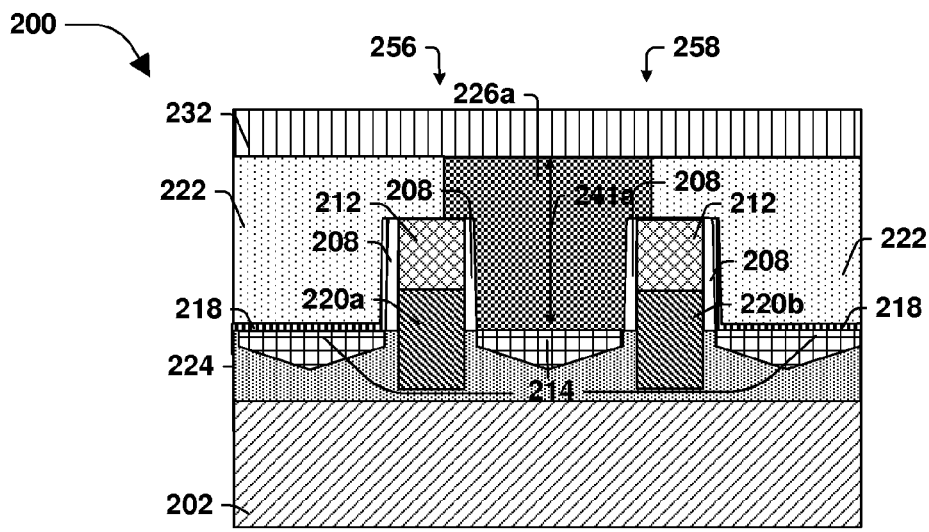
FIG. 30 is an illustration of a semiconductor arrangement, according to some embodiments.
Figure 31:
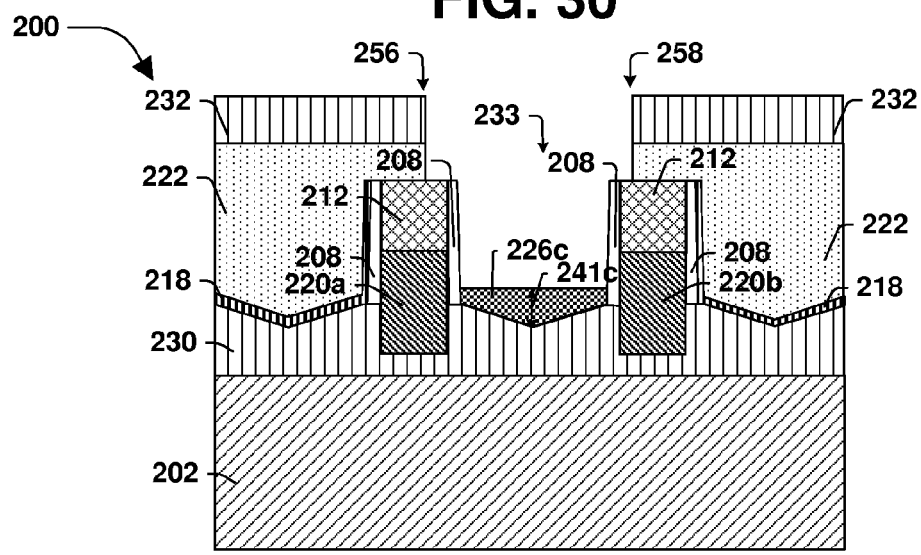
FIG. 31 is an illustration of a semiconductor arrangement, according to some embodiments.
Figure 32:
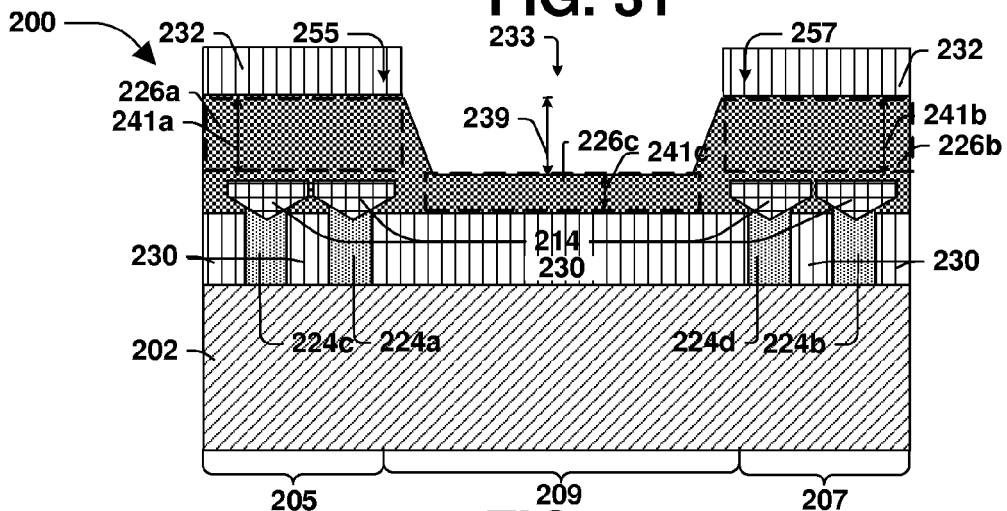
FIG. 32 is an illustration of a semiconductor arrangement, according to some embodiments.

At 108, the initial metal connect height is recessed in the STI region 209, to form a recessed portion 226c of the metal connect 226, as illustrated in FIGS. 30-32. In some embodiments, a second mask 232 is formed over the metal connect 226 over the first active region 205 and the second active region 207, such that the metal connect 226 over the STI region 209 is exposed. In some embodiments, the initial metal connect height is recessed by etching. In some embodiment, the forming the recessed portion 226c, contemporaneously forms a first unrecessed portion 226a of the metal connect 226 over the first active region 205, as illustrated in FIGS. 30 and 32, and forms a second unrecessed portion 226b of the metal connect 226 over the second active region 207, as illustrated in FIG. 32. In some embodiments, the recessed portion 226c of the metal connect 226 has a top portion, the top portion at the same height as a bottom portion of the first unrecessed portion 226a, where the height is measured from a top portion of the substrate 202. In some embodiments, the recessed portion 226c has a second height 241c between about 5 Å to about 50 Å, as illustrated in FIGS. 31-32. In some embodiments, the first unrecessed portion 226a has a first height 241a between about 100 Å to about 500 Å, as illustrated in FIGS. 30 and 32. In some embodiments, the second unrecessed portion 226b has a third height 241b between about 100 Å to about 500 Å, as illustrated in FIG. 32. In some embodiments, the first height 241a, the second height 241c and the third height 241b are measured from a top portion of the metal connect 226 to a bottom portion of the metal connect 226. In some embodiments, the first height 241a is substantially equal to the third height 241b. In some embodiments, the fourth height and the fifth height of the fins 224 are substantially equal to the second height. In some embodiments, the forming the recessed portion 226c forms a recessed opening 233 over the STI region 209. In some embodiments, the recessed opening has a recessed height between about 100 Å to about 500 Å, as illustrated in FIG. 31-32.

Figure 33:
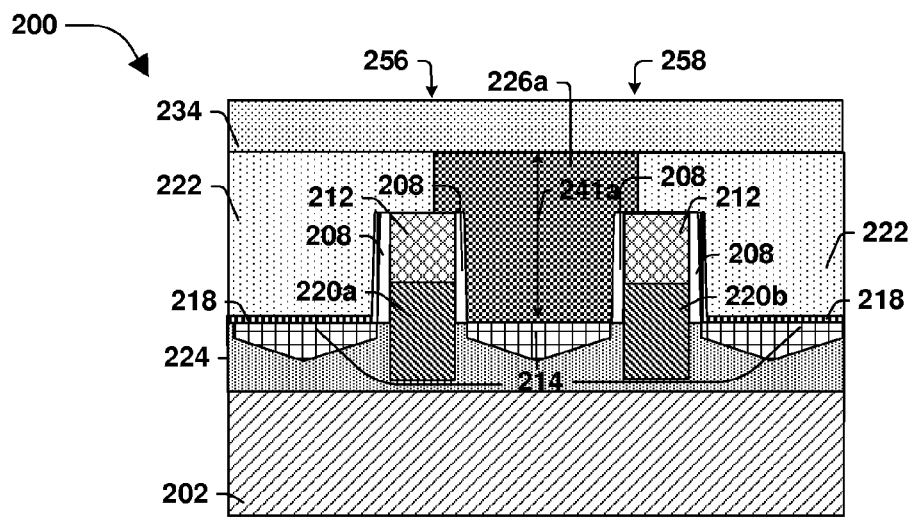
FIG. 33 is an illustration of a semiconductor arrangement, according to some embodiments.
Figure 34:
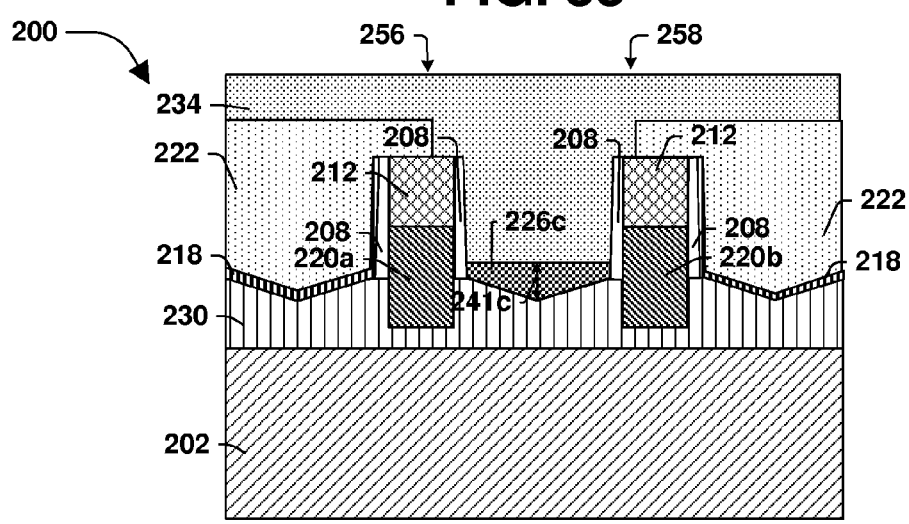
FIG. 34 is an illustration of a semiconductor arrangement, according to some embodiments.
Figure 35:
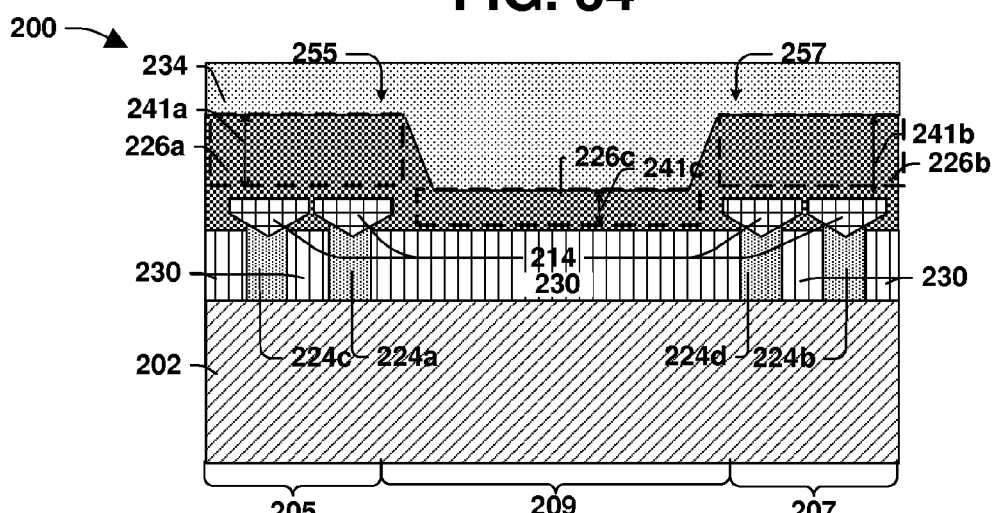
FIG. 35 is an illustration of a semiconductor arrangement, according to some embodiments.

According to some embodiments, the second mask 232 is removed, such as by CMP and a second dielectric layer 234 is formed over the first dielectric layer 222 and the metal connect 226, as illustrated in FIGS. 33-35. In some embodiments, the second dielectric layer 234 comprises oxide. In some embodiments, the second dielectric layer 234 is one of grown or deposited. In some embodiments, the second dielectric layer 234 is planarized, such as by CMP.

Figure 36:
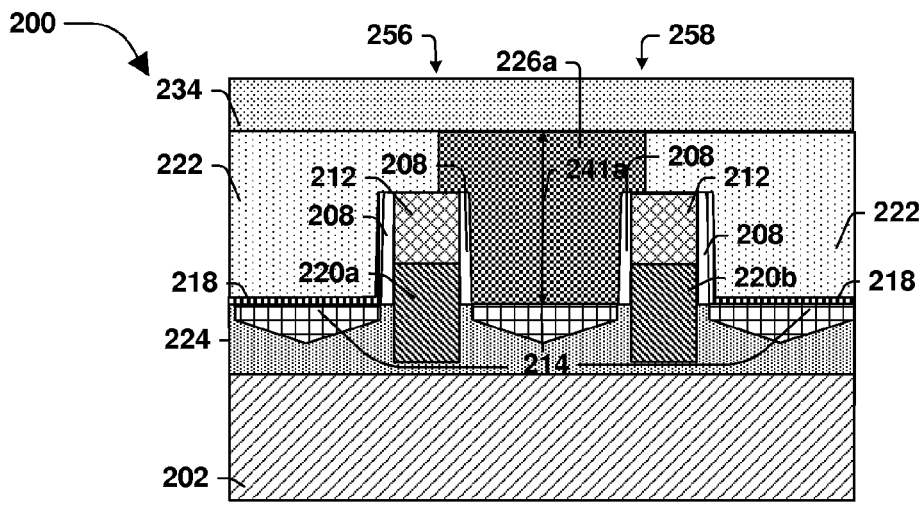
FIG. 36 is an illustration of a semiconductor arrangement, according to some embodiments.
Figure 37:
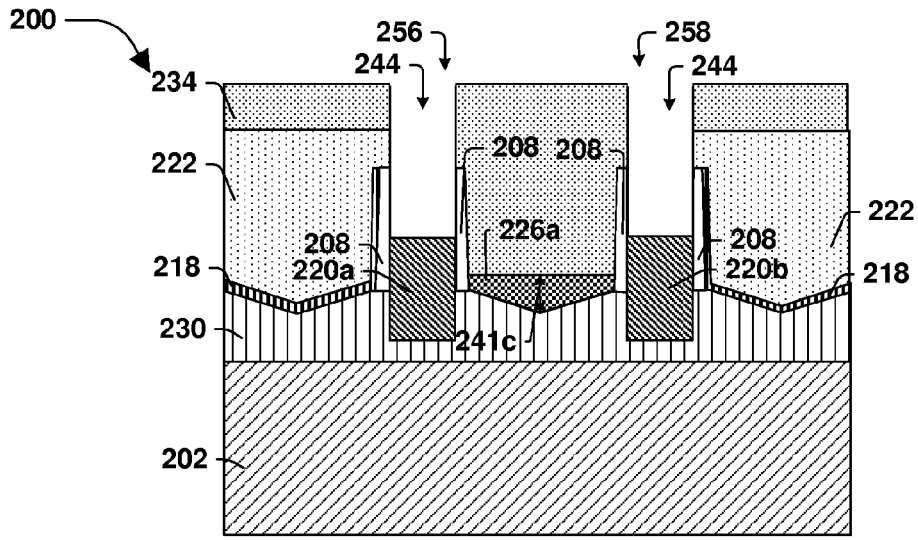
FIG. 37 is an illustration of a semiconductor arrangement, according to some embodiments.

According to some embodiments, a first contact opening 244a is formed over the first gate 220a and a second contact opening 244b is formed over the second gate 220b, such that a top surface of the first gate 220a and a top surface of the second gate 220b are exposed, as illustrated in FIGS. 36-38. In some embodiments, the first contact opening 244a and the second contact opening 244b are formed by etching. In some embodiments, a first metal contact 245a is formed, such as by deposition, in the first contact opening, such that the first metal contact 245a is in contact with the first gate 220a, as illustrated in FIG. 40. In some embodiments, a second metal contact 245b is formed, such as by deposition, in the second contact opening 244b, such that the second metal contact 245b is in contact with the second gate 220b. In some embodiments, the first metal contact 245a and the second metal contact 245b comprise metal. In some embodiments, the first metal contact 245a is a first metal contact distance 247a from the recessed portion 226c of the metal connect 226, as illustrated in FIG. 40. In some embodiments, the second metal contact 245b is a second metal contact distance 247b from the recessed portion 226c of the metal connect 226. In some embodiments, the first metal contact distance 247a and the second metal contact distance 247b is between about 5 nm to about 20 nm.

According to some embodiments, a semiconductor arrangement comprises a first active region, a second active region, a shallow trench isolation (STI) region between the first active region and the second active region and a metal connect over the first active region, the STI region and the second active region. In some embodiments, the metal connect is connected to the first active region and the second active region, such that a first unrecessed portion of the metal connect over the first active region has a first height, a recessed portion of the metal connect over the STI region has a second height and a second unrecessed portion of the metal connect over the second active region has a third height. In some embodiments, the first height and the third height are greater than the second height.

According to some embodiments, a method of forming a semiconductor arrangement comprises forming a first opening over a first active region, a shallow trench isolation (STI) region and a second active region, such that the first opening exposes a portion of the first active region and the second active region. In some embodiments, the method of forming a semiconductor arrangement comprises forming a metal connect in the first opening, such that the metal connect is connected to the first active region and the second active region and such that the metal connect has an initial height. In some embodiments, the method of forming a semiconductor arrangement comprises recessing the initial height of the metal connect in the STI region to form a recessed portion of the metal connect having a second height, such that the second height is less than a first height of a first unrecessed portion of the metal connect over the first active region and a third height of a second unrecessed portion of the metal connect over the second active region, the first height substantially equal to the third height.

According to some embodiments, a semiconductor arrangement comprises a first active region, a second active region, a shallow trench isolation (STI) region between the first active region and the second active region and a metal connect over the first active region, the STI region and the second active region. In some embodiments, the metal connect is connected to the first active region and the second active region, such that a first unrecessed portion of the metal connect over the first active region has a first height, a recessed portion of the metal connect over the STI region has a second height and a second unrecessed portion of the metal connect over the second active region has a third height. In some embodiments, the first height and the third height are greater than the second height. In some embodiments, a first gate is adjacent a first side of the metal connect and a second gate is adjacent a second side of the metal connect. In some embodiments, the first gate and the second gate are over the first active region, the STI region and the second active region and connected to the first active region and the second active region.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement comprising:
    forming a first opening over a first active region, a shallow trench isolation (STI) region and a second active region, such that the first opening exposes a portion of the first active region and the second active region;
    forming a metal connect in the first opening, such that the metal connect is connected to the first active region and the second active region and the metal connect has an initial height; and
    recessing the initial height of the metal connect in the STI region to form a recessed portion of the metal connect having a second height, such that the second height is less than a first height of a first unrecessed portion of the metal connect over the first active region and a third height of a second unrecessed portion of the metal connect over the second active region, the first height substantially equal to the third height.

2. The method of claim 1, the recessing comprising reducing the initial height such that a top portion of the recessed portion is at a same height as a bottom portion of the first unrecessed portion of the metal connect.

3. The method of claim 1, comprising forming a first gate adjacent a first side of the metal connect and forming a second gate adjacent a second side of the metal connect, the first gate and the second gate over the first active region, the STI region and the second active region and connected to the first active region and the second active region.

4. The method of claim 3, comprising forming a first metal contact over the first gate and a forming a second metal contact over the second gate.

5. The method of claim 1, comprising:
    forming a first epitaxial (Epi) cap over a first fin adjacent a first side of the STI region; and
    forming a second Epi cap over a second fin adjacent a second side of the STI region.

6. A method for forming a semiconductor arrangement comprising:
    forming a first fin and a second fin;
    forming a first dielectric between the first fin and the second fin, the first dielectric defining a shallow trench isolation (STI) region;
    forming a first epitaxial cap over the first fin and a second epitaxial cap over the second fin;
    forming a second dielectric over the first epitaxial cap, the second epitaxial cap, and the STI region;
    forming an opening within a portion of the second dielectric, the opening over the STI region, the first epitaxial cap, and the second epitaxial cap;
    forming a metal connect in the opening, the metal connect in contact with the first epitaxial cap and the second epitaxial cap; and
    removing a portion of the metal connect in the STI region.

7. The method of claim 6, the removing a portion of the metal connect in the STI region comprising:
removing some but not all of the metal connect in the STI region.

8. The method of claim 6, comprising:
forming epitaxial cap openings in the first fin, the second fin, and the STI region prior to the forming a first epitaxial cap and a second epitaxial cap.

9. The method of claim 8, the forming a first epitaxial cap and a second epitaxial cap comprising:
growing the first epitaxial cap within a first epitaxial cap opening formed in the first fin; and
growing the second epitaxial cap within a second epitaxial cap opening formed in the second fin.

10. The method of claim 9, the forming a metal connect comprising:
forming the metal connect in a third epitaxial cap opening formed in the STI region.

11. The method of claim 10, wherein the first epitaxial cap opening, the second epitaxial cap opening, and the third epitaxial cap opening form a continuous epitaxial cap opening.

12. The method of claim 6, comprising:
forming a mask over a second portion of the metal connect over the first epitaxial cap and a third portion of the metal connect over the second epitaxial cap, wherein the mask exposes the portion of the metal connect in the STI region.

13. The method of claim 12, the removing comprising:
etching the portion of the metal connect in the STI region while exposed through the mask.

14. The method of claim 6, comprising:
forming a dummy gate prior to the forming a first epitaxial cap and a second epitaxial cap, the dummy gate extending over the first fin, the second fin, and the STI region.

15. The method of claim 14, comprising:
replacing, after the forming a second dielectric, one or more materials of the dummy gate with at least one of a polysilicon or a metal to form a gate.

16. The method of claim 6, comprising:
forming a third epitaxial cap over the first fin.

17. The method of claim 16, wherein the opening is not formed over the third epitaxial cap.

18. A method of forming a semiconductor arrangement comprising:
forming a first opening over a first active region, a shallow trench isolation (STI) region and a second active region;
forming a metal connect in the first opening, the metal connect in contact with a first epitaxial cap of the first active region and a second epitaxial cap of the second active region;
forming a mask over a first portion of the metal connect in contact with the first epitaxial cap and a second portion of the metal connect in contact with the second epitaxial cap, the mask exposing a third portion of the metal connect over the STI region; and
etching the third portion of the metal connect over the STI region to reduce a height of the metal connect over the STI region.

19. The method of claim 18, comprising:
forming a first gate and a second gate prior to the forming a metal connect, the first gate extending over the first active region, the STI region, and the second active region.

20. The method of claim 19, the forming a metal connect comprising:
forming the metal connect between the first gate and the second gate.

* * * * *